US000001217H

United States Statutory Invention Registration [19]

[11] Reg. Number: H1217

Phelps [43] Published: Aug. 3, 1993

[54] EASILY TUNABLE DETECTOR FOR COVERING DISCONTINUITIES IN BURIED ENERGIZED ANTENNA GROUND WIPES

[75] Inventor: John H. Phelps, San Diego, Calif.

[73] Assignee: The United States of America as represented by the Secretary of the Navy, Washington, D.C.

[21] Appl. No.: 841,338

[22] Filed: Feb. 25, 1992

[51] Int. Cl.[5] ..... G01R 19/00
[52] U.S. Cl. ..... 324/67; 324/326
[58] Field of Search ..... 324/67, 326

[56] References Cited

U.S. PATENT DOCUMENTS

| | | | |
|---|---|---|---|
| 3,597,680 | 8/1971 | Haddon | 324/326 |
| 4,427,942 | 1/1984 | Sole | 324/67 X |
| 4,639,674 | 1/1987 | Rippingale | 324/326 |
| 5,043,666 | 8/1991 | Tavernetti et al. | 324/326 |

OTHER PUBLICATIONS

Hansen, Peder M., Antenna Buried Ground Wire Locator, Navy Technical Disclosure Bulletin, vol. 9, No. 1, Sep. 1983, pp. 25–29.

Seeley, Elwin W., Ground Conductor Fault Detector, Informal Technical Report, Naval Ocean Systems Center, Feb. 11, 1982, pp. 1–6.

*Primary Examiner*—Bernarr E. Gregory
*Attorney, Agent, or Firm*—Harvey Fendelman; Thomas Glenn Keough; Peter A. Lipovsky

[57] ABSTRACT

The ground-wire detector of the invention is a portable device used to locate buried ground-wires of an energized very low frequency/low frequency antenna system operating within the frequency range of 15 kHz to 200 kHz. This ground-wire detector has an oscillator section that is tunable by a dial located on the detector. Because of this feature, an operator can change the oscillator's frequency without the need for component replacement.

The detector of the invention includes two series-connected oppositely-wound coplaner coils spaced approximately 15 inches apart. The coils are oppositely wound to generate a maximum detection signal when centered over an energized ground-wire. The coils generate a detection signal when placed within the vertical magnetic fields formed by energized antenna ground-wires and are designed to incur minimal interference from the large horizontal magnetic field radiating from an adjacent transmitting antenna station.

In the ground-wire detector of the invention, the transmitter station frequency radiated by the buried ground-wires and detected by the instrument's coils, is mixed with a tuning frequency selected by a device operator and generated from a continuously tunable oscillator made a part of the ground-wire detector. The difference between the tuning frequency and that of the energized ground-wires is audio amplified and routed to a set of monaural headphones.

6 Claims, 1 Drawing Sheet

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

EASILY TUNABLE DETECTOR FOR COVERING DISCONTINUITIES IN BURIED ENERGIZED ANTENNA GROUND WIPES

STATEMENT OF GOVERNMENT INTEREST

The invention described herein may be manufactured and used by or for the Government of the United States or America for governmental purposes without the payment of any royalties thereon or therefor.

BACKGROUND OF THE INVENTION

1. Field of the Invention

This invention pertains broadly to the field of magnetic detection devices. More particularly, the invention pertains to a device for locating energized antenna ground-wires in the presence of a transmitting antenna.

2. Description of the Related Art

The U.S. Navy is interested in identifying causes of efficiency loss in its low frequency and very low frequency shore transmitters. It is known that some of these losses occur in a transmitter's antenna and, specifically, are due to breakage in conductors that compose a radially spreading ground-wire system for the antenna. As the number of ground-wire breaks increase, the radiation efficiency of a transmitter drops, adversely affecting the antenna's communication range.

The radiation efficiency of an antenna, and therefore of the entire transmitter, is dependent upon the electrical contact between the plane of buried antenna ground-wires and the earth. These ground planes are composed of hundreds of bare copper wires placed in the area around the antenna. The wires are often broken by subsequent earth work such as farming, utility connections, and landscaping.

A ground-wire detector can be used to locate the subterranean ground-wires before excavation work in the area is underway. In addition, a ground-wire detector can serve to identify where breaks in the buried ground-wires are located.

In the past, a portable instrument for detecting and locating ground-wires and their breaks was developed by the Navy. This unit worked on an autodyne principle and contained an oscillator section whose frequency was dependent in part upon two capacitors that had to be interchanged according to the frequency of the antenna system being studied. The need to alter this oscillator by way of component replacement posed field logistics problems that were considered undesirable.

SUMMARY OF THE INVENTION

The ground-wire detector of the invention is a portable device used to locate buried ground-wires of an energized very low frequency/low frequency antenna system operating within the frequency range of 15 kHz to 200 Khz. This ground-wire detector has an oscillator section that is tunable by a dial located on the detector. Because of this feature, an operator can change the oscillator's frequency without the need for component replacement.

The detector of the invention includes two series-connected oppositely-wound coplaner coils spaced approximately 15 inches apart. The coils are oppositely wound to generate a maximum detection signal when centered over an energized ground-wire. The coils generate a detection signal when placed within the vertical magnetic field formed by an energized antenna ground-wire and are designed to incur minimal interference from the large horizontal magnetic field radiating from an adjacent transmitting antenna station.

In the ground-wire detector of the invention, the transmitter station frequency radiated by the buried ground-wires and detected by the instrument's coils, is mixed with a tuning frequency selected by a device operator and generated from a continuously tunable oscillator made a part of the ground-wire detector. The difference between the tuning frequency and that of the energized ground-wires is audio amplified and routed to a set of monaural headphones for operator perception.

OBJECTS OF THE INVENTION

It is an objective of this invention to provide an improved magnetic field detector.

Another object of this invention is to provide a magnetic field detector that detects and locates an energized wire buried in the ground.

Yet a further object of this invention is to provide an improved antenna ground-wire detector that may be tuned without the need for detector component replacement.

DESCRIPTION OF THE PREFERRED EMBODIMENT

Figures 1, 2:
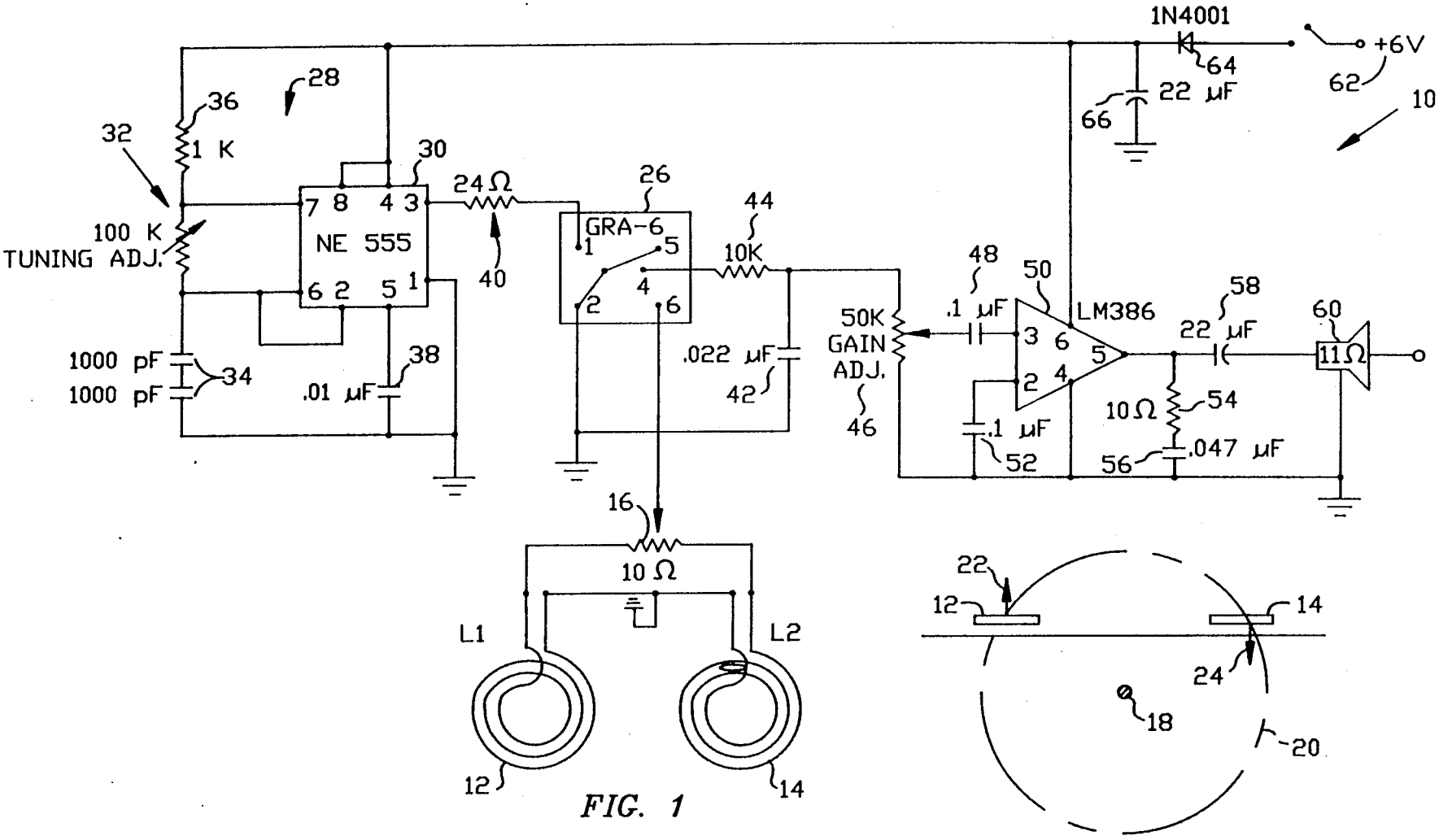
FIG. 1 is a schematic representation of the ground-wire detector of the invention.
FIG. 2 is a perspective diagrammatic view of the invention's detector coils disposed within a magnetic field radiated by a buried energized antenna ground-wire.

Referring now to FIG. 1 there is shown a ground-wire detector 10 according to the invention. As can be seen, ground-wire detector 10 incorporates the use of two series-connected oppositely-wound coplaner coils 12 and 14. In the implementation of the invention used, each of these coils contained about 200 turns of scrambled wound wire on a solenoid form, each making a pancake solenoid. As no two coils can be made identically the same, the dissimilar voltage generating characteristics of the coils are balanced by way of potentiometer 16.

Referring now to both FIGS. 1 and 2 when coils 12 and 14 are centered above a buried current-carrying horizontal antenna ground-wire 18, the coils receive a maximum detection signal from the polarized vertical magnetic field 20 that surrounds energized wire 18. For the geometry shown in FIG. 2, the magnetic field components induce a voltage within coils 12 and 14 shown by the vectors 22 and 24, respectively. Vectors 22 and 24 take this orientation if it is assumed that current-carrying ground-wire 18 is carrying current into the plane of the paper this figure is drawn upon.

The horizontally disposed coils prefer sensing vertical magnetic fields, such as those from buried horizontal ground-wires, as opposed to horizontally arranged fields such as those from an adjacent transmitting antenna connected to the ground wires. If any part of the transmitting antenna magnetic field is induced into the coils, it is further cancelled by the out-of-phase coil arrangement. By this arrangement it is possible to detect small ground-wire currents in the presence of the large magnetic field caused by an adjacent adjoining antenna.

As the presence of ground-wire 18's magnetic field will induce signals to be generated in coils 12 and 14, a break in ground-wire 18 can also be detected as a sudden decrease in the strength of these induced signals.

Referring once again to FIGS. 1 and 2, the transmitter station frequency that is radiated by ground-wire 18 and embodied by induced voltages 22 and 24 is applied to pin 6 of a mixer 26. The frequency of the signals induced within coils 12 and 14, here named the detected frequency, is mixed within balance mixer 26 with an offset frequency generated by a continuously tunable oscillator section 28. Oscillator section 28 includes a local oscillator chip 30 that produces a fixed preselected oscillator frequency. This oscillator frequency is tuned by way of potentiometer 32 so as to produce an offset frequency that corresponds to the frequency of an adjacent transmitting antenna connected to the ground wires. This offset frequency is derived by a device operator adjusting the potentiometer until a pleasant tone produced by the filtered mixing of the detected and offset frequency, is heard over the device's loudspeaker.

In FIG. 1, serially connected 1000 picofarad capacitors 34 serve to set the range of frequency of oscillator 30. Resistor 36 functions as a current limiter and capacitor 38 is part of the reset circuit for the internal oscillator of oscillator chip 30. Oscillator chip 30's output at pin 3 is current limited by resistor 40 to prevent diode damage within balance mixer 26.

Within balance mixer 26 the detected frequency of the induced signals from coils 12 and 14 is mixed with the offset frequency provided by continuously tunable oscillator section 28. Sum and difference frequencies are produced of which capacitor 42 is used to filter out the sum of the mixed offset and detected frequencies. The output at pin 4 of balance mixer 26 passes through resistor 44 that attenuates overpowering signals.

Though the difference frequency signal from balance mixer 26 is at a signal strength equal to the signal strength of the signals induced within coils 12 and 14, this signal strength may actually be relatively low, such as, for example, where the ground-wire detector is used on antenna ground-wires located a great distance from an adjoining antenna. Because of this, a 50 kΩ gain adjustment 46 is provided. The gain adjusted signal then passes through a coupling capacitor 48 that in turn feeds its output to an audio amplifier 50.

Audio amplifier 50 is used to enhance sensitivity of the ground-wire detector. Capacitor 52 is used for signal bypassing. In addition, resistor 54 and capacitor 56 serve as a stabilizing network to prevent signal oscillation. The output of audio amplifier is passed through coupling capacitor 58 whose output is then passed to an audio headphone 60 for operator listening.

A 6-volt power supply 62 supplies circuit power through a protecting diode 64 and an anti-oscillation capacitor 66.

In operation, tuning adjustment 32 is dialed to an appropriate frequency corresponding to the transmitting frequency of an antenna system being diagnosed. This is done by an operator of the ground-wire detector listening through his headphones for a tone while the transmitter station is operating on-the-air. Tuning adjustment 32 is adjusted to create a comfortable listening tone and gain adjustment 46 is used for volume control.

The use of the ground-wire detector is similar to that of a metal detector. The operator sweeps the detector back and forth with its coils roughly perpendicular to the ground in which the ground radials are buried.

A maximum signal to the headphones will occur when the ground-wire detector is centered over an energized antenna ground-wire. Under these maximum signal conditions, the coils of the ground-wire detector will be equally distant from the ground-wire radial. The direction of the ground-wire can then be traced and mapped out using this method. In addition, changes in received signal strength will indicate that there is a break in the ground-wire or that the ground-wire has otherwise terminated.

Those skilled in the applicable arts will realize that to further enhance operator perception of the presence of, or abscence of, buried energized ground wires, a meter giving a visual read-out of detected ground wire fields could be made a part of the ground wire detector of the invention.

Obviously, many modifications and variations of the present invention are possible in the light of the above teachings. It is therefore to be understood that within the scope of the appended claims, the invention may be practiced otherwise than as has been specifically described.

What is claimed is:

1. An apparatus for locating an energized antenna ground-wire surrounded by a magnetic field, said apparatus comprising:

continuously tunable oscillator means for generating a tuned offset frequency corresponding to a preselected antenna transmitting frequency;

detector means for detecting said magnetic field by generating an induced signal when within said magnetic field, said induced signal being at a detected frequency equal to said preselected antenna transmitting frequency and having a signal strength that is greatest when said detector means is centered over said energized antenna ground-wire;

frequency difference means for generating a detection signal at a frequency equal to the difference between said tuned offset frequency and said detected frequency and at a signal strength equal to said signal strength of said induced signal; and tone generator means for converting said detection signal into an audible tone so that a listener knows from the presence of said tone that an energized antenna ground-wire has been detected and knows from the strength of said tone the location of said energized antenna ground wire with respect to said apparatus.

2. An apparatus according to claim 1 in which said continuously tunable oscillator means includes an oscillator chip for producing a fixed oscillator frequency and a potentiometer operably coupled to said oscillator chip so that said fixed oscillator frequency may be tuned by way of said potentiometer to produce said tuned offset frequency.

3. An apparatus according to claim 2 in which said detector means includes two series-connected oppositely-wound coplanar coils that when disposed substantially horizontally within said magnetic field generate said induced signal.

4. An apparatus according to claim 3 in which said frequency difference means includes a balanced mixer for producing sum and difference frequencies of said tuned offset frequency and said detected frequency, and a filter for filtering out said sum frequency.

5. An apparatus according to claim 4 in which said tone generator means includes an adjustable audio amplifier for amplifying said detection signal and a loudspeaker for making said detection signal audible.

6. An apparatus for locating an energized antenna ground-wire surrounded by a magnetic field, said apparatus comprising:

continuously tunable oscillator means for generating a tuned offset frequency corresponding to a preselected antenna transmitting frequency, said continuously tunable oscillator means including an oscillator chip for producing a fixed oscillator frequency and a potentiometer operably coupled to said oscillator chip so that said fixed oscillator frequency may be tuned by way of said potentiometer to produce said tuned offset frequency;

detector means for detecting said magnetic field by generating an induced signal when within said magnetic field, said induced signal being at a detected frequency equal to said preselected antenna transmitting frequency and having a signal strength that is greatest when said detector means is centered over said energized antenna ground-wire, said detector means including two series-connected oppositely-wound coplanar coils that when disposed substantially horizontally within said magnetic field generate said induced signal;

frequency difference means for generating a detection signal at a frequency equal to the difference between said tuned offset frequency and said detected frequency and at a signal strength equal to said signal strength of said induced signal, said frequency difference means including a balanced mixer for producing sum and difference frequencies of said tuned offset frequency and said detected frequency, and a filter for filtering out said sum frequency; and tone generator means for converting said detection signal into an audible tone so that a listener knows from the presence of said tone that an energized antenna ground-wire has been detected and knows from the strength of said tone the location of said energized antenna ground wire with respect to said apparatus, said tone generator means including an adjustable audio amplifier for amplifying said detection signal and a loudspeaker for making said detection signal audible.

* * * * *